United States Patent [19]

Higgins, III

[11] Patent Number: 5,221,858
[45] Date of Patent: Jun. 22, 1993

[54] TAPE AUTOMATED BONDING (TAB) SEMICONDUCTOR DEVICE WITH GROUND PLANE AND METHOD FOR MAKING THE SAME

[75] Inventor: Leo M. Higgins, III, Austin, Tex.

[73] Assignee: Motorola, Inc., Schaumburg

[21] Appl. No.: 834,964

[22] Filed: Feb. 14, 1992

[51] Int. Cl.⁵ ............................................. H01L 23/50
[52] U.S. Cl. .................................... 257/666; 257/691; 257/668
[58] Field of Search ..................... 357/70, 80; 257/666, 257/668, 691

[56] References Cited

U.S. PATENT DOCUMENTS

| | | | |
|---|---|---|---|
| 4,496,965 | 1/1985 | Orcutt et al. | 357/70 |
| 4,711,700 | 12/1987 | Cusak | 357/70 |
| 4,899,185 | 2/1990 | Newman | 346/162 |
| 4,912,547 | 3/1990 | Bilowith et al. | 357/80 |
| 5,028,983 | 7/1991 | Bickford et al. | 357/70 |
| 5,036,380 | 7/1991 | Chase | 357/70 |
| 5,053,921 | 10/1991 | Nelson et al. | 361/386 |
| 5,089,878 | 2/1992 | Lee | 357/70 |
| 5,099,306 | 3/1992 | Dunaway et al. | 357/70 |
| 5,142,351 | 8/1992 | Matta | 357/70 |

Primary Examiner—Rolf Hille
Assistant Examiner—S. V. Clark
Attorney, Agent, or Firm—Patricia S. Goddard

[57] ABSTRACT

A TAB semiconductor device (10) has a ground plane which is electrically coupled to ground leads without traditional conductive vias. Instead of using vias, a ground plane (34) has a plurality of ground leads (36) embossed on a surface of the ground plane in a first TAB leadframe (14), thereby forming one monolithic ground plane assembly. The ground leads are shaped to form inner lead portions (46) and outer lead portions (48) which are bonded to a semiconductor die (38) and a substrate (not illustrated), respectively. A second TAB leadframe (12) forms signal leads (16). The two leadframes are superimposed with each other to form a composite, multilayered TAB leadframe structure. Improved electrical and physical continuity between the ground leads and the ground plane help to lower lead inductance.

14 Claims, 5 Drawing Sheets

TAPE AUTOMATED BONDING (TAB) SEMICONDUCTOR DEVICE WITH GROUND PLANE AND METHOD FOR MAKING THE SAME

CROSS-REFERENCE TO RELATED APPLICATION

The present application is related to a commonly assigned, co-pending application by Leo M. Higgins III entitled, "Semiconductor Device With Integral Decoupling Capacitor," Ser. No. 07/834,929, filed Feb. 14, 1992.

FIELD OF THE INVENTION

The present invention relates to semiconductor devices in general, and more specifically to semiconductor devices having ground planes and methods for making such devices.

BACKGROUND OF THE INVENTION

Tape Automated Bonding (TAB) is a widely used technique for packaging and mounting semiconductor devices. TAB has several desirable characteristics which make it attractive to semiconductor manufactures. For instance, TAB permits highly automated manufacturing and is suitable for use in high lead count semiconductor devices. In addition, TAB technology helps to keep device size to a minimum, whereas other packaging technology adds significant bulk to the device.

A typical TAB leadframe includes a pattern of metal leads formed on an insulating carrier tape. The carrier tape is most often a polymer, such as a polyimide or polyester. The metal leads are formed by patterning a thin metal foil, usually copper, using conventional lithography and etching procedures or by additive plating processes. Portions of the polymer tape are then removed to create free-standing portions of the leads which are subsequently bonded to terminals of a substrate, such as a semiconductor die or a printed circuit board.

For more complex devices, particularly those requiring a voltage plane, a multilayer TAB tape is used. Rather than having one conductive layer formed on the carrier tape, a conductive layer is formed on each side of the tape. Generally, one conductive layer is used as a voltage plane, for instance a ground plane, while the other conductive layer is used to form a plurality of individual leads. Leads which are designated as ground leads are electrically coupled to the voltage plane by conductive vias which extend through the carrier tape, keeping other leads electrically isolated from the voltage plane.

Use of a ground plane in high performance semiconductor devices is often necessary to lower both self- and mutual inductance created in device leads and to reduce cross-talk by creating a constant characteristic impedance environment for signal leads. Known multilayer TAB tapes such as that described above provide only a limited improvement in lowering lead inductance in a semiconductor device. The effectiveness of utilizing a ground plane in a conventional multilayer TAB tape is restricted by the size, number, and position of the vias used to electrically couple the ground plane and ground leads. To maximize the reduction of inductance, it is desirable to have as many vias as possible, vias which are as large as possible, and vias which are as close to the semiconductor die as possible in order to reduce the ground return loop, thereby effectively lowering inductance. Existing multilayer TAB tapes typically use only three to six vias per ground lead. These vias are restricted in size and position by the width of each lead. While in theory it is desirable to have ground leads as wide as possible to lower inductance, in practice ground lead width is restricted by the need to have a lead density which is as high as possible. Therefore the advantages of high lead count versus low inductance must be compromised with existing multilayer TAB technology.

Apart from providing limited improvement in lowering device inductance, existing multilayer TAB tapes also have a disadvantage with respect to fabrication complexity. Conventional multilayer TAB tapes are processed using additive plating or sequential lamination processes. One possible additive plating process involves plating metal, for example copper, on both sides of a polymer tape. Vias are then formed through one metal layer and through the polymer material to the opposing metal layer by either etching, drilling, or punching operations. The vias are then plated with a conductive material to provide electrical continuity between selected portions of the the two metal layers. Sequential lamination involves laminating a metal foil to each side of a punched polymer tape. Conductive vias are formed by plating through punched, etched, or drilled vias as described above. The punching, etching, drilling, and plating processes required to form the vias are extremely difficult, primarily due to the small geometries involved. Multilayer TAB tape manufacturing has significant yield loss due to the steps required for via formation. The small geometries and complex processes also contribute to reliability problems with the electrical contact between the vias, leads, and ground plane. To the semiconductor device manufacturer, such process complexity results in very high costs for multilayer TAB tapes and raises concerns about the reliability of devices having such tapes.

Therefore, semiconductor manufacturers would benefit from an alternative approach to existing multilayer TAB technology, and more particularly would benefit from an approach which 1) reduces process complexity in manufacturing TAB leadframes by eliminating conductive via formation, thereby lower costs of leadframes to semiconductor manufacturers, and 2) improves device performance by lowering mutual and self-inductance.

SUMMARY OF THE INVENTION

The present invention overcomes the aforementioned problems associated with the prior art. In one form of the invention, a semiconductor device has a semiconductor die having a plurality of voltage pads and a plurality of signal pads formed on a surface thereof. A multilayer leadframe of the device includes a first conductive layer which forms a plurality of signal leads. The plurality of signal leads is electrically coupled to the plurality of signal pads on the die. The multilayer leadframe also includes a second conductive layer which forms a voltage plane having a plurality of voltage leads embossed on a surface thereof. Each of the voltage leads has an inner lead portion which lies substantially in a common plane with the plurality of signal leads of the first conductive layer. The inner lead portions of the voltage leads are electrically coupled to the plurality of voltage pads on the die. The multilayer leadframe also has a dielectric which separates portions of the first and second conductive layers.

These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

With the present invention, Tape Automated Bonding (TAB) techniques are used in high performance semiconductor devices which require a voltage plane, particularly a ground plane, without having to form conductive vias in a TAB tape. Via formation is avoided in one form of the present invention by superimposing two individually processed TAB leadframes. By eliminating the need to form vias, the present invention provides a less complex TAB tape manufacturing process, thereby lowering costs to semiconductor manufacturers. Another advantage in using two separate leadframes is that the yield of one leadframe does not adversely affect the yield of the other. In addition, a device in accordance with present invention has enhanced electrical performance due to reduced inductance. Reduced inductance is achieved by using relatively thick ground leads which are embossed on a surface of a ground plane such that the ground plane and ground leads form a monolithic structure.

Figure 1:
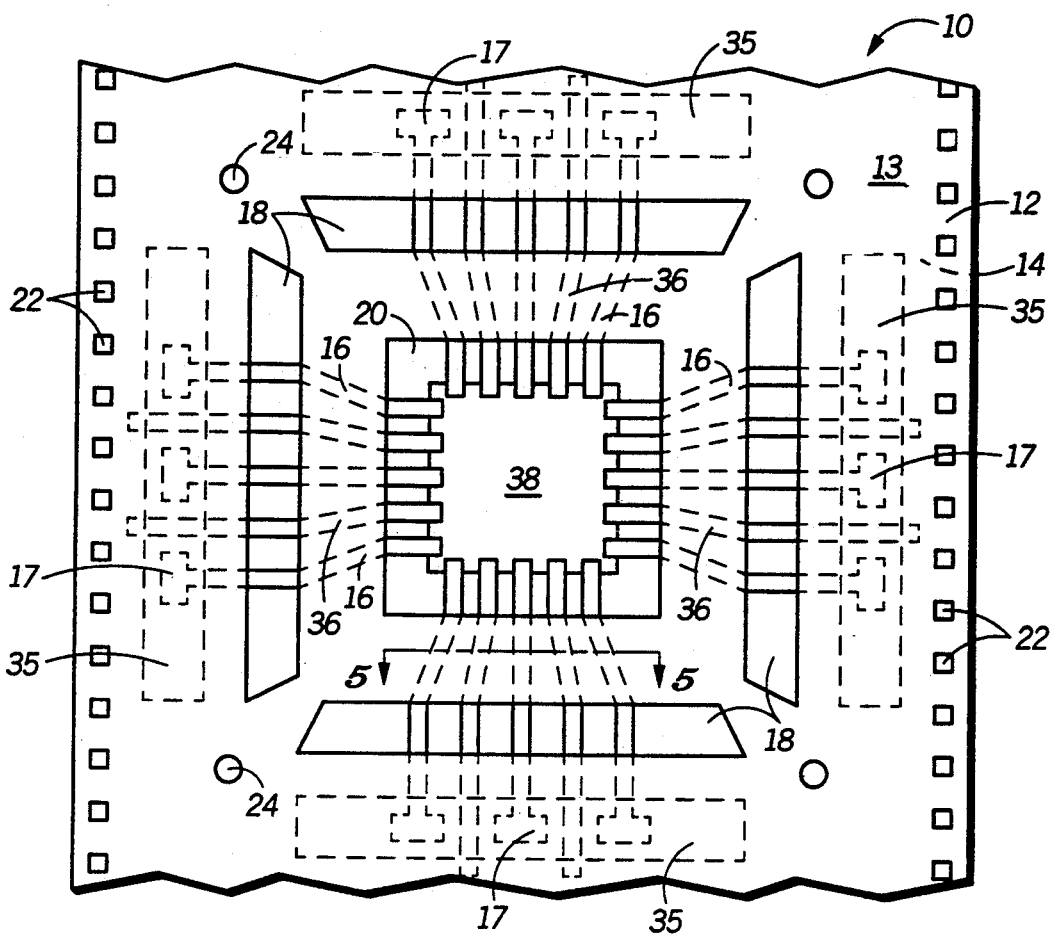
FIG. 1 is a plan view of a TAB semiconductor device in accordance with the present invention.

Specific details of the present invention will become more clearly understood in reference to the accompanying drawings. Illustrated in FIG. 1 is a plan view of a semiconductor device 10 in accordance with the present invention. Device 10 includes a first TAB leadframe 12 superimposed with a second TAB leadframe 14. As illustrated, first TAB leadframe 12 is positioned on top of second TAB leadframe 14. The first and second TAB leadframes are also illustrated individually in FIG. 2 and FIG. 3 respectively.

Figure 2:
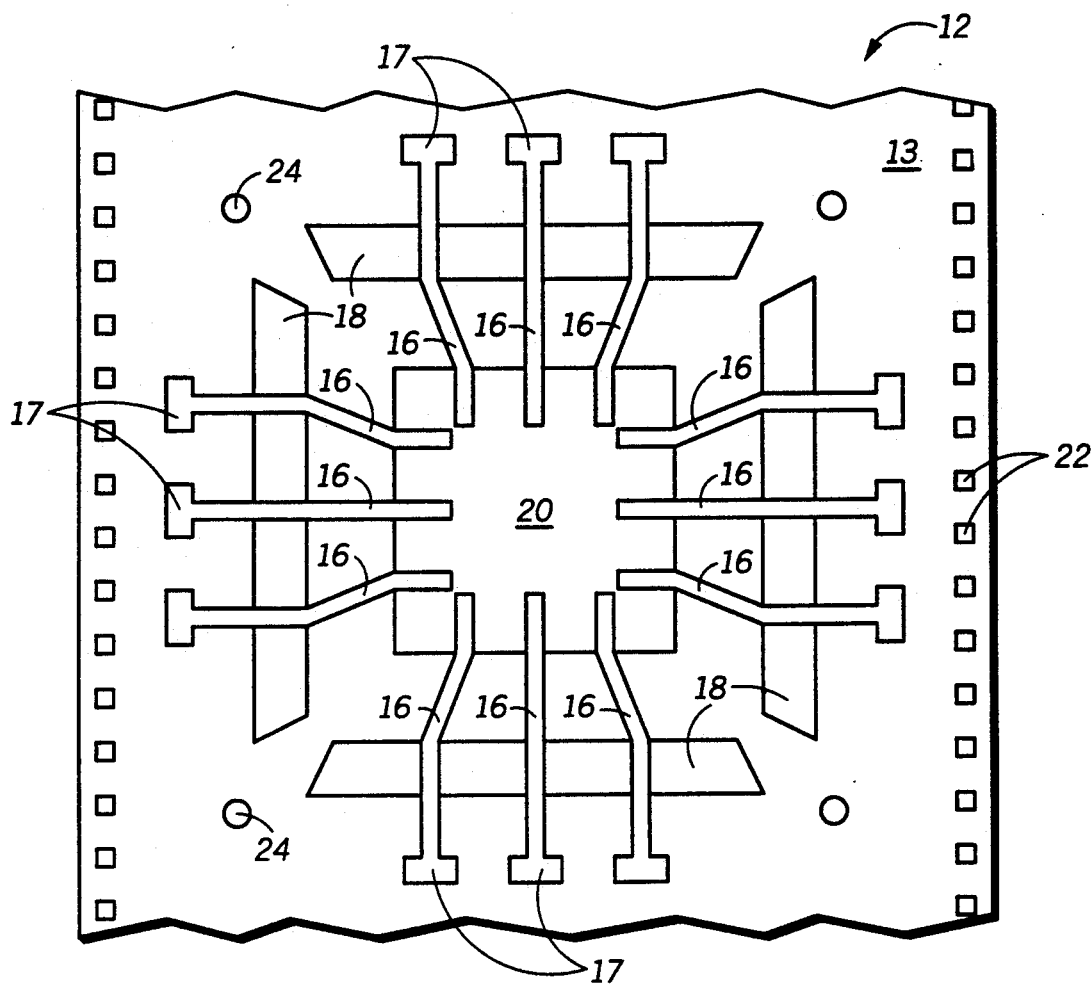
FIG. 2 is a plan view of a first TAB leadframe included in the device of FIG. 1. The first TAB leadframe forms a plurality of signal leads.

First TAB leadframe 12, as illustrated in FIG. 2, is formed of an insulative carrier tape 13. Carrier tape 13 is preferably a polymer material, such as a polyimide used in existing TAB tape structures. A plurality of signal leads or traces 16 are formed on a front surface or face of carrier tape 13. In FIG. 2, the front surface of carrier tape 13 is displayed, while in FIG. 1 an opposing back surface of carrier tape 13 is displayed (thus the need for partially hidden lines indicating elements which are beneath the carrier tape). Not all signal leads are labelled in FIG. 1 for purposes of clarity, but each are labelled in FIG. 2. As the name implies, signal leads 16 are used to transmit electrical signals to and from device 10. Since most devices also require voltage supply, signal leads 16 may include power supply system leads as well. Signal leads 16 are generally made of copper, gold-plated copper, solder-plated copper, or tin-plated copper, and are formed on carrier tape 13 by conventional lithography and etching methods or by additive plating.

At the outer end of each signal lead 16 is a test pad 17, as illustrated in FIG. 2. The test pads are usually formed at the same time as the signal leads during leadframe manufacture and are most often of the same material. Test pads 17 are used as contact sites during functional testing of the device, prior to excising the device from the leadframe. Also included in first TAB leadframe 12 are outer lead bonding (OLB) openings 18 and an inner lead bonding opening (ILB) 20 which are each formed in carrier tape 13. A plurality of sprocket holes 22 and alignment holes 24 are also provided in the carrier tape. Alignment holes 24 are used to properly align first TAB leadframe 12 in manufacturing equipment, while sprocket holes 22 are used to index the leadframe from one position to another within the equipment. Each of the holes and openings in leadframe 12 are formed using known punching and/or etching processes.

Figure 3:
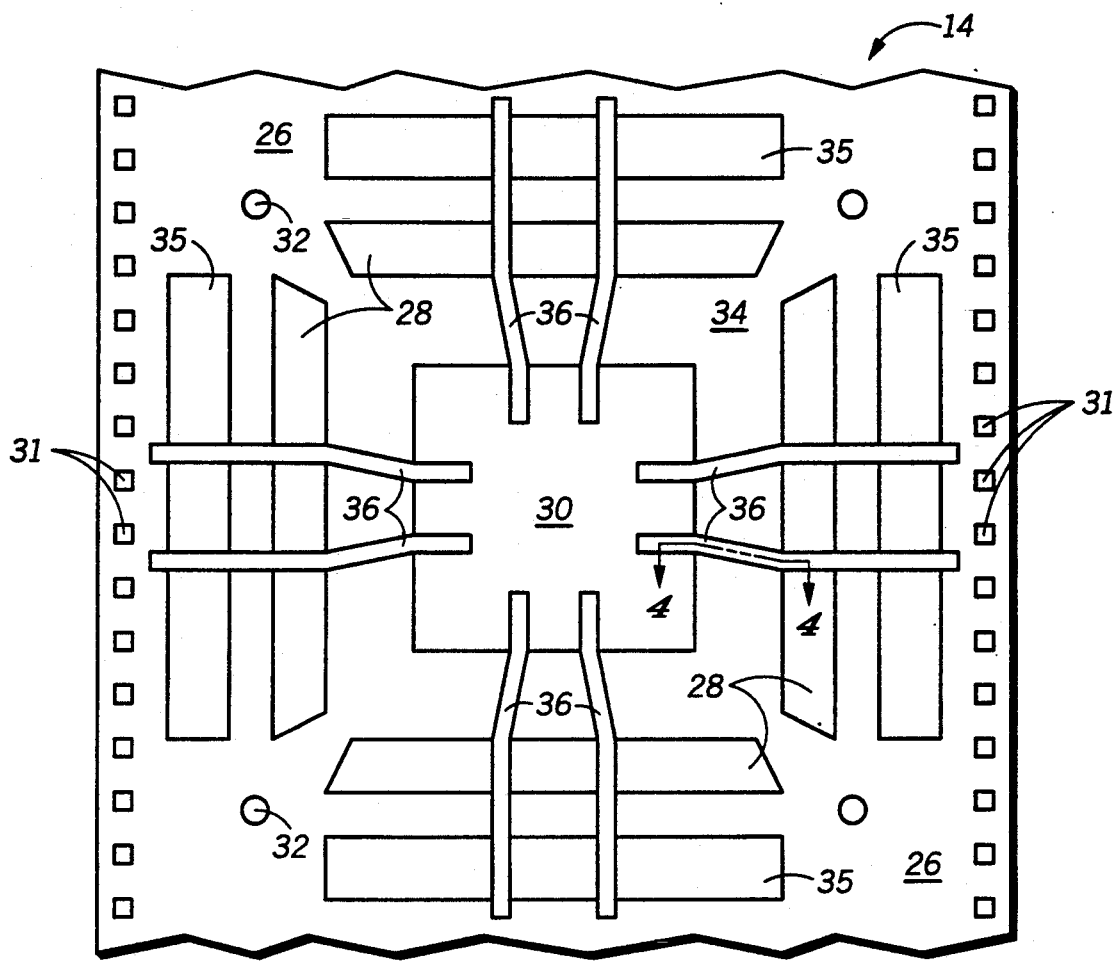
FIG. 3 is a plan view of a second TAB leadframe included in the device of FIG. 1. The second TAB leadframe forms a ground plane and a plurality of ground leads.
Figure 8:
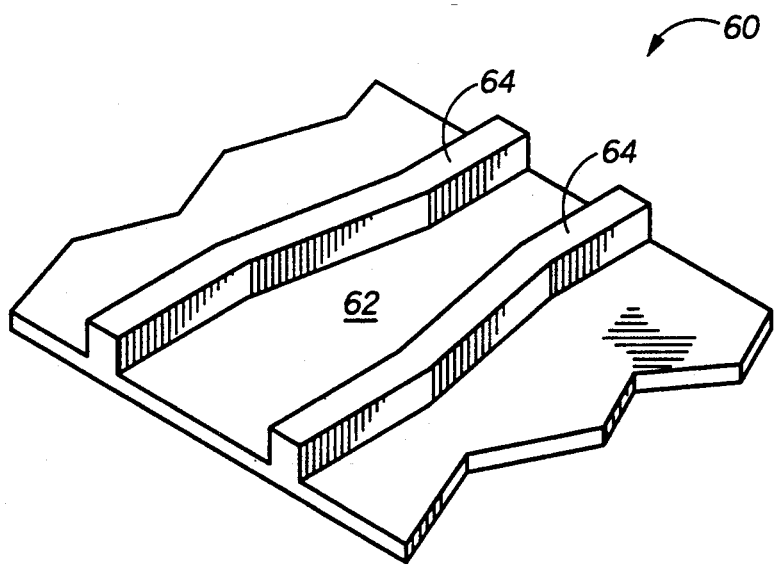
FIGS. 8-12 illustrate one method for forming a TAB device in accordance with the present invention.

Second TAB leadframe 14 is formed of a conductive thin film or foil 26, which is preferably a copper foil. Rather than being formed entirely of a conductive material, leadframe 14 may be formed of a polymer carrier tape (not shown) similar to carrier tape 13 of leadframe 12. A conductive foil could then be laminated to or plated on a surface of the carrier tape to form leadframe 14. As illustrated in FIG. 3, outer lead bond (OLB) openings 28 and an inner lead bond (ILB) opening 30 are formed in conductive foil 26, or alternatively in an insulating carrier tape as described above. Also provided in leadframe 14 are test pad openings 35, which as illustrated in FIG. 1 are aligned to permit access to test pads 17. Each of the ILB, OLB, and test pad openings, along with sprocket holes 31 and alignment holes 32, are formed in leadframe 14 by conventional punching or etching process.

Bounded by OLB openings 28 is an annular ground plane 34 which encircles ILB opening 30, as illustrated in FIG. 3. Ground plane 34 is formed as part of conductive foil 26. Rather than being a ground plane, the annular plane can be used as any other voltage reference plane including, but not limited to, a power voltage plane. A plurality of ground leads 36 are included on a front face of leadframe 14. As with the annular voltage plane, leads 36 may be used for a voltage other than ground. However, a preferred embodiment utilizes an annular ground plane having a plurality of ground leads. Ground leads 36 are embossed on a surface of ground plane 34 such that the ground leads and ground plane form one continuous structure. Ground leads 36 are formed partially above ground plane 34, or in other words extend in a direction perpendicular to the plane of the figure toward the reader, as will become evident below.

Figure 4:
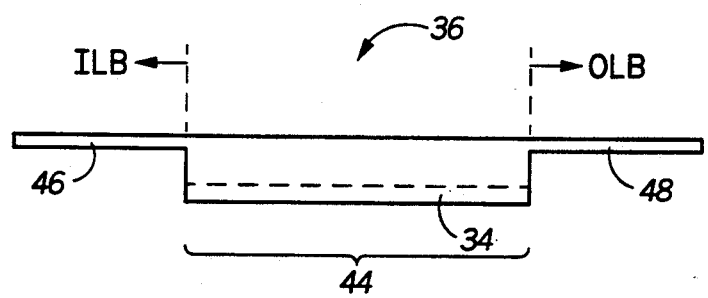
FIG. 4 is a cross-sectional view of a ground lead taken along the line 4—4 of FIG. 3.

FIG. 4 illustrates in cross-section one of the ground leads of FIG. 3 taken along the line 4—4. In accordance with the present invention, ground lead 36 has an embossed central portion 44, the bottom surface of which is part of ground plane 34. Central portion 44 is embossed with respect to the ground plane. Extending from, and attached to, central portion 44 are an inner lead bonding (ILB) portion 46 and an outer lead bonding (OLB) portion 48. Referring to both FIG. 3 and FIG. 4, ILB portion 46 is that portion of ground lead 36 which extends into ILB opening 30 of leadframe 14. Similarly, OLB portion 48 is that portion of the lead which extends into OLB opening 28. The ILB and OLB portions of ground lead 36 are each shaped like a cantilever or ledge extending from central portion 44 in order to facilitate bonding operations. Thicknesses of the ILB portion and the OLB portion of the ground lead should be similar to or equal to the thickness of the signal leads of the device so that all leads have a uniform thickness for bonding purposes. For similar reasons, the signal leads and the ILB and OLB portions of the ground leads should lie substantially in a common plane in regions which are to be bonded to a die or substrate. An explanation of how ground leads 36 may be formed in accordance with the present invention is provided subsequently in reference to FIGS. 8–12.

Referring again to FIG. 1, first TAB leadframe 12 and second TAB leadframe 14 are formed separately and are superimposed with one another and bonded together, preferably in a face-to-face or front-to-front relationship, such that ground leads 36 are interspersed with signal leads 16. The first and second TAB leadframes can be properly positioned with respect to one another by aligning alignment holes 24 to alignment holes 32. Upon positioning the two leadframes together, the leadframes can be handled as one composite unit. An advantage of the composite structure illustrated in FIG. 1 is that leads are less likely to be electrically short-circuited by particles such as dust. Due to the face-to-face relationship of the leadframes, the only portion of signal leads 16 which are exposed to the environment are those exposed through ILB opening 20 and OLB openings 18 (i.e. those portions not illustrated as hidden in FIG. 1). A majority of the leads are protected from the environment by insulating carrier tape 13. Another advantage of the composite nature of device 10 is that leadframes 12 and 14 are manufactured individually, such that the yield of one leadframe does not impact the yield of the other. Therefore, the overall yield of the composite leadframe structure is independent of the yields of the individual leadframes.

After forming one composite leadframe structure, inner portions of both signal leads 16 and ground leads 36 are electrically coupled to bond pads (not shown in FIG. 1) of a semiconductor die 38 during a process known as inner lead bonding (ILB). All leads may be individually or simultaneously bonded to the die using commercially available thermocompression bonding tooling. Following ILB, device 10 is manufactured in a tradition manner. Manufacturing steps used to complete device 10 may include: encapsulation of die 38 and ILB portions of the leads; electrical test and burn-in of the device; and outer lead bonding (OLB) of the leads to a substrate, such as a printed circuit board or another leadframe.

Figure 5:
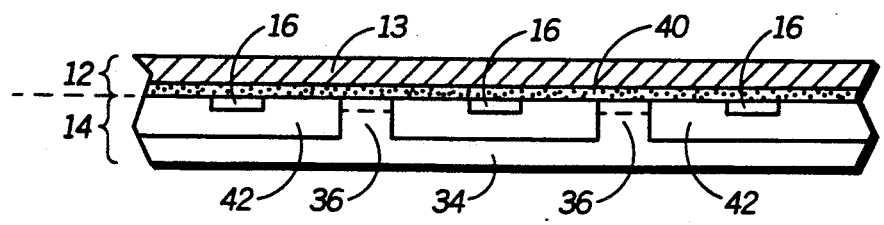
FIG. 5 is a cross-sectional view of the device of FIG. 1 taken along the line 5—5.

A portion of device 10 is illustrated in cross-section in FIG. 5, namely the portion of the device along the line 5—5 of FIG. 1. As FIG. 5 illustrates, first leadframe 12 is positioned over second leadframe 14 such that signal leads 16 of the first leadframe are interspersed with ground leads 36 of the second leadframe. Although it is illustrated such that the signal and ground leads have alternating locations (i.e. one ground lead is positioned between two adjacent signal leads), such lead order is not necessary in practicing the present invention. Furthermore, the number of leads illustrated is merely representative and in no way limits the invention. In addition to the two groups of leads being interspersed, the ends of signal leads 16 and ground leads 36 are also co-planar to facilitate ILB and OLB of the leads to a semiconductor die or substrate. Inner lead portions of ground leads 36 are indicated by hidden lines in FIG. 5 and are illustrated in more detail in FIG. 4.

First leadframe 12 as illustrated in FIG. 5 includes polymer carrier tape 13. Preferably an adhesive material 40 is formed on a surface of carrier tape 13 in order to hold signal leads 16 to the carrier tape. Adhesive material 40 is formed on the polymer tape prior to forming the signal leads. Upon aligning first leadframe 12 to second leadframe 14, portions of adhesive material 40 are brought in contact with ground leads 36. The adhesive material can be used to bond the ground leads of second leadframe 14 to first leadframe 12, thereby bonding the two leadframes together. If adhesive material 40 is a thermosetting material or is not able to be activated to adhere to ground leads 36, an additional adhesive material (not shown) may be applied to one of the two leadframes. Specifically, an additional adhesive material could be bonded to the upper surface of each ground lead 36. TAB tape manufacturers often coat polymer carrier tapes with an adhesive material to improve adhesion between the polymer tape and conductive leads. Examples of adhesive materials used in the industry include polyimides, epoxies, acrylics, variants of these materials, and the like. Such adhesive materials, including both thermosets and thermoplastics, are also suited for use in the present invention.

As indicated in FIG. 5, ground leads 36 are embossed on ground plane 34 so that the ground leads and ground plane form one monolithic structure. In one embodiment of the present invention, ground leads 36 and signal leads 16 are separated from one another by air-gaps 42. The air-gaps are inherent to the device since the ground leads extend above the ground plane. The presence of air-gaps between the ground and signal leads serves to minimize cross-talk between the leads since air has a very low dielectric constant ($\epsilon_{r,air} = 1$). The low $\epsilon_r$ of air provides low capacitive loading on signal leads 16, thereby also reducing power consumption of the device. As an alternative to air, an insulating adhesive material having a dielectric constant on the order of 3.5 or less can be incorporated onto one of the leadframes so that air-gaps 42 would be filled with the low-dielectric adhesive material rather than being filled with air.

Figure 6:
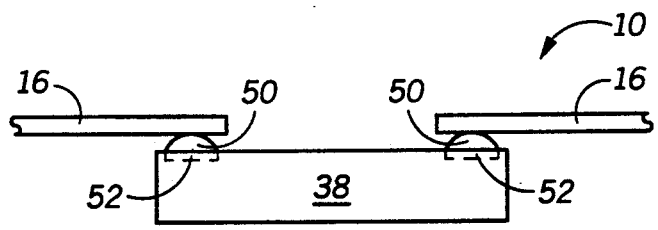
FIG. 6 is a cross-sectional view of the device of FIG. 1 through the semiconductor die and through two signal leads.
Figure 7:
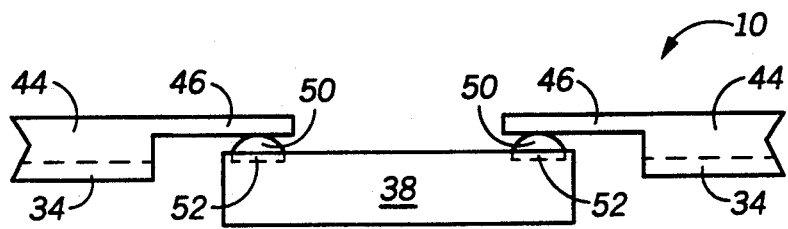
FIG. 7 is a cross-sectional view of the device of FIG. 1 through the semiconductor die and through two ground leads.

FIGS. 6 and 7 illustrate cross-sections of device 10 through signal leads and ground leads, respectively, which are bonded to semiconductor die 38. Each of the leads are bonded to the die using known techniques. Typically a metallurgical bump 50 is formed on a bond pad 52 of the die. The leads are bonded individually or simultaneously to the bumps by thermocompression bonding. It is evident from FIG. 7 that ILB portions 46 of ground leads 36 are shaped to resemble conventional leads or traces, such as signal leads 16. Central portions 44 of the ground leads, on the other hand, are much thicker, allowing the entire central portion of the ground leads to be in full physical and electrical contact with ground plane 34.

The present invention has several advantages over existing TAB leadframes and semiconductor devices. One advantage, as mentioned above, is that the entire central portion 44 of each ground lead is in contact with ground plane 34. As a result of this physical and electrical continuity between the ground leads and ground plane, voltage drops during device operation are less likely to occur. In conventional TAB leadframes, ground leads are coupled to a ground plane by a limited number of conductive vias. The size and location of these vias limits the extent to which voltage fluctuations in the ground plane can be controlled. With the present invention, each ground lead is tied to a ground plane by a very large conductive area, namely by central portion 44. Thus, inductance during device operation is lowered with the present invention, primarily due to the shape of the ground leads, the fact that the ground leads are physically integrated with the ground plane, and because the ground return loop is minimized.

Another advantage of the present invention is that fabrication of a TAB leadframe which includes a voltage reference plane is simplified in comparison to existing methods. As pointed out previously, the present invention eliminates the need to form conductive vias in order to electrically couple ground leads to a ground plane. Via formation involves intricate drilling, lithography, plating, and etching techniques which significantly add to the cost of producing TAB leadframes, costs which are passed on to semiconductor device manufacturers and ultimately to device users. The use of such intricate processing techniques also adversely affects yield of quality leadframes, driving costs up further. In the present invention, ground leads are embossed on a surface of the ground plane, such that the ground leads and ground plane are one continuous structure. Because vias formation is not necessary in practicing the invention, manufacturing complexity is diminished and costs are kept low.

One method which can be used to make a TAB leadframe with a ground plane and ground leads in accordance with the present invention is illustrated in FIGS. 8-12. Each of these figures has been simplified to include only a portion 60 of a TAB leadframe. Portion 60 includes a metal foil 62 which is preferably copper. Embossed on a surface of the metal foil are two raised strips 64 which will eventually form two ground leads. Strips 64 can be formed in a variety of ways on metal foil 62. One method is to provide a relatively thick metal foil and perform a stamping operation which compresses the foil while leaving raised strips 64. An alternative method is to provide a relatively thick metal foil, mask those portions of the foil which are to form the strips, and etch unmasked portions of the foil until reaching a desire foil thickness. Yet another approach is to form the strips using a selective deposition process, whereby material is deposited only in the strip area until a desired strip thickness is achieved. It is also possible to conductively bond raised strips 64 to metal foil 62 to achieve the structure illustrated in FIG. 8.

Figure 9:
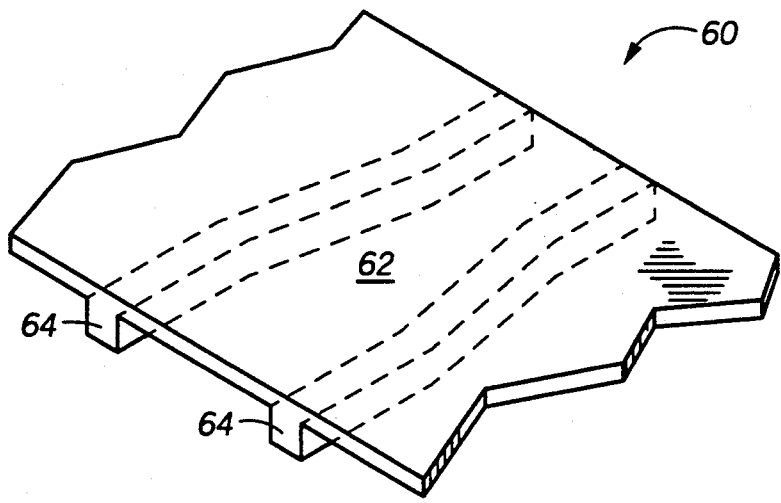
Figure 10:
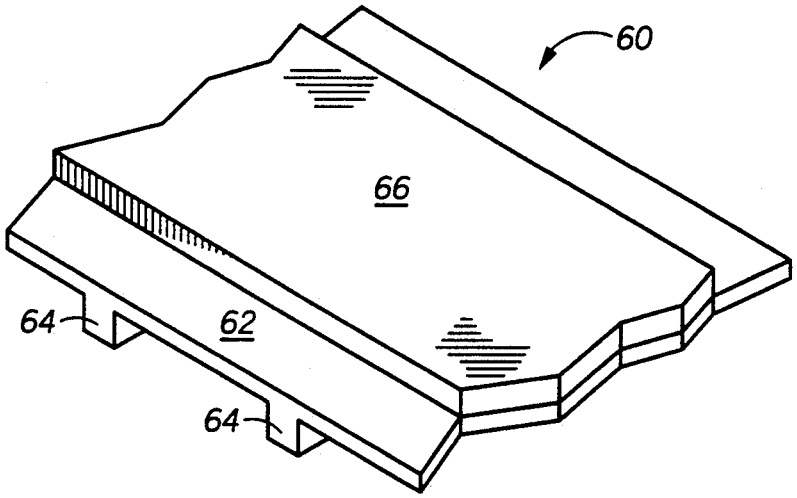
Figure 11:
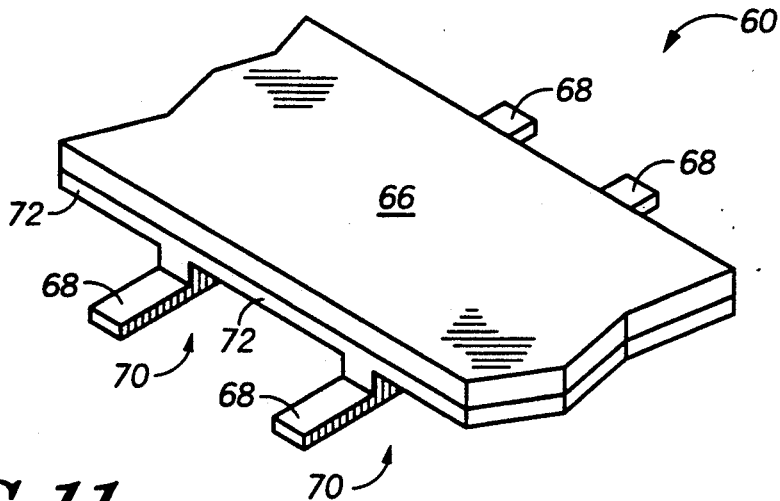
Figure 12:
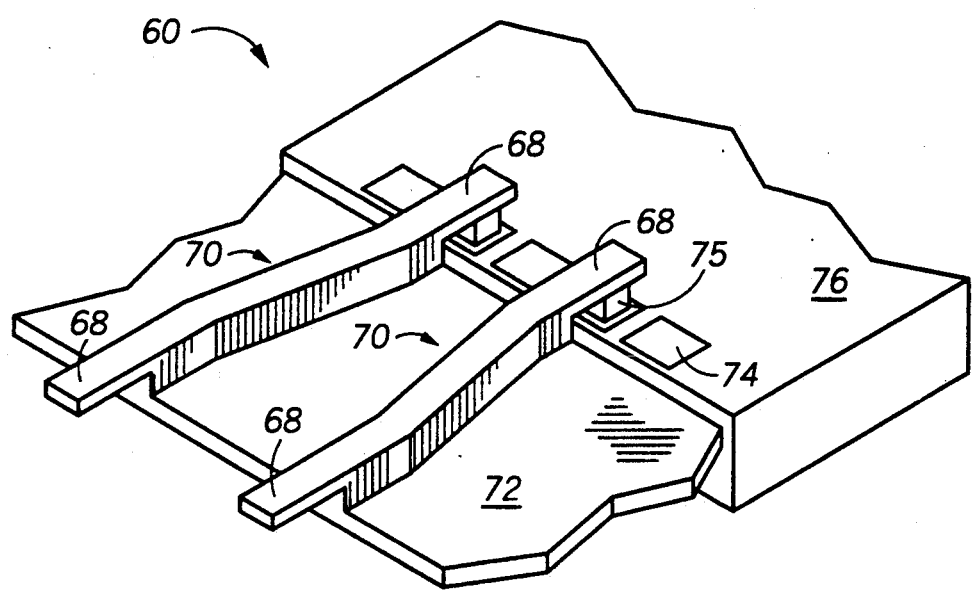

After raised strips 64 are formed, the leadframe is turned over, as illustrated in FIG. 9. A masking layer 66 is then formed on the metal foil. Masking layer 66, illustrated in FIG. 10, is formed on selected portions of the metal foil. More specifically, masking layer 66 protects those portions of metal foil 62 which will be used as a ground plane, such as ground plane 34 of FIG. 3. Materials which are suited for use as masking layer 66 include those which are commonly used in TAB tape and leadframe manufacturing, for example photoresist materials. Conventional lithography techniques are used to pattern the masking layer into the appropriate shape. After the masking layer is formed, the leadframe is etched to remove unmasked portions of metal foil layer 62 and partially remove unmasked portions of strips 64. The etch is terminated at a point in which ledges 68 are formed in strips 64, as illustrated in FIG. 11. The ledges, together with the unetched portions of strips 64, form ground leads 70. Ledges 68 of ground leads 70 are analogous to the ILB and OLB portions of ground leads 36 of FIG. 5. The masked portion of the metal foil layer which does not get etched forms a ground plane 72 which is contiguous with ground leads 70. After the ground leads and ground plane have been formed, masking layer 66 may be removed if desired, or the masking layer may be left in place to electrically insulate the back of the ground plane. The resulting structure, as it may appear electrically coupled to bond pads 74 of a semiconductor die 76, is illustrated in FIG. 12.

Alternative processing steps may be used to form a ground plane and ground leads in accordance with the present invention. For instance, stamping operations, rather than etching steps, can be used to form the ground plane and ground leads. A combination of various stamping and etching steps may also be used. As an example, metal foil 62 could be etched to form ground plane 72 while strips 64 could be stamped to form ledges 68. The ground plane assembly could also be formed using entirely subtractive etching procedures. Conductively bonding independently formed ground leads to a ground plane is yet another processing alternative.

The foregoing description and illustration contained herein demonstrate many of the advantages associated with the present invention. In particular, it has been revealed that in forming very thick ground leads which are integral with a ground plane of a semiconductor device, lead inductance is reduced, thereby reducing cross-talk in the device. Capacitance between ground leads and signal leads is kept low due to the presence of a dielectric material, preferably air, which has a low dielectric constant ($\epsilon_r$). Furthermore, the present invention provides the ability to vary the characteristic impedance of a semiconductor device. As examples, impedance can be controllably varied by changing the height or thickness of the embossed regions of the ground leads or by varying the type or thickness of a dielectric material used to separate the ground leads from the signal leads. In addition, the width of the grounds leads in a device in accordance with the present invention can be kept small because the electrical connection of the entire ground lead to the ground plane is sufficient to reduce inductance. Utilizing narrower ground leads has the advantage of permitting a higher lead density in a device and/or permitting the space between leads to be increased to further reduce cross-talk. Yet another advantage is that the present invention is more immune to electrical short circuiting of leads due to particle contamination. Because two leadframes are superimposed in a face-to-face relationship in one embodiment of the present invention, a majority of the leads are protected from the environment by the polymer carrier tape of one of the leadframe. Moreover, it has been demonstrated that a semiconductor device in accordance with the present invention can be fabricated without conductive via formation, thereby reducing fabrication complexity.

Thus it is apparent that there has been provided, in accordance with the invention, a TAB semiconductor device having a ground plane and a method for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, aspects of the present invention can be extended to devices and leadframes other than TAB. Multilayer or multilevel metal leadframes used in molded plastic packages may incorporate concepts disclosed herein, such as the use of ground leads which are embossed on a ground plane and the idea of superimposing two leadframes, one of which is a reference voltage plane. It is also anticipated that in practicing the invention, more than two leadframes can be combined, producing a semiconductor device having two or more voltage reference planes. By superimposing a third leadframe which forms a power plane, a semiconductor device having both power and ground planes can be made with the teachings of the present invention. In addition, the invention is not limited to using two or more individually processed leadframes. As an example, a composite leadframe having signal leads, ground leads, and a ground plane similar to those herein described may be formed from one multilayer leadframe which undergoes a series of masking, etching, stamping, laminating, and/or depositing processes, rather than by joining two separate leadframes together. Furthermore, more than one ground plane segment could be formed. For instance, the ground plane layer or leadframe could be formed to provide a plurality of electrically isolated segments to permit independent ground connection to selected portions of a semiconductor die. Another anticipated variation of the present invention is the use of a power plane having embossed power leads, rather than use of a ground plane having embossed ground leads has been emphasized.

Due to the rapid changes in semiconductor manufacturing technology, it is envisioned that new materials and new manufacturing techniques will allow for many improvements to the present invention. Therefore, it is important to note that the present invention is not limited in any way to those materials specifically described. Nor is the invention limited to those manufacturing processes herein mentioned. Furthermore, since semiconductor devices continue to become smaller and smaller, the dimensions listed are merely representative and in no way restrict the invention. It is, therefore, intended that this invention encompass all such variations and modifications as fall within the scope of the appended claims.

I claim:

1. A semiconductor device comprising:
   a semiconductor die having a plurality of reference voltage pads and a plurality of signal pads formed on a surface thereof; and
   a multilayer leadframe structure comprising:
      a first conductive layer which forms a plurality of signal leads, the plurality of signal leads being electrically coupled to the plurality of signal pads on the die;
      a second conductive layer separated from the first conductive layer which forms a reference voltage plane having a plurality of reference voltage leads embossed on a surface thereof, each of the reference voltage leads having an inner lead portion and a central lead portion, wherein the inner lead portion of each reference voltage lead is contiguous with, and thinner than, a corresponding central lead portion of each reference voltage lead and each inner lead portion is electrically coupled to one of the plurality of reference voltage pads on the die, and wherein the central lead portion of each reference voltage lead is contiguous with the reference voltage plane and has a thickness sufficient to make the inner lead portion of each reference voltage lead substantially coplanar with the signal leads; and
      a dielectric separating portions of the first and second conductive layers.

2. The semiconductor device of claim 1 wherein the reference voltage plane of the second conductive layer is annular and encircles the semiconductor die.

3. The semiconductor device of claim 1 wherein the reference voltage plane is a ground plane and the plurality of reference voltage leads are ground leads.

4. The semiconductor device of claim 1 wherein the multilayer leadframe is a TAB leadframe structure.

5. The semiconductor device of claim 4 wherein the TAB leadframe structure comprises a first TAB leadframe which forms the plurality of signal leads and a second TAB leadframe which forms the reference voltage plane and the plurality of reference voltage leads, and wherein the first TAB leadframe is superimposed with the second TAB leadframe.

6. The semiconductor device of claim 1 wherein the dielectric is an adhesive material.

7. The semiconductor device of claim 1 wherein the reference voltage leads of and the signal leads of the device are at least partially separated by air.

8. The semiconductor device of claim 1 wherein the reference voltage leads of and the signal leads of the device are at least partially separated by an adhesive material having a dielectric constant less than or equal to 3.5.

9. A tape automated bonding (TAB) semiconductor device comprising:
   a first TAB leadframe having a ground plane formed of a continuous conductive film and a plurality of ground leads embossed on a surface of the ground plane such that the ground plane and ground leads form a monolithic structure, each ground lead having an inner lead portion, a central lead portion, and an outer lead portion, wherein the inner and outer lead portions of each ground lead are contiguous to opposing sides of the central lead portion, wherein the central lead portion of each ground lead is contiguous with the ground plane, and wherein the central portion of each ground lead has a thickness sufficient to elevate the inner and outer lead portions of the ground leads away from the ground plane;
   a second TAB leadframe having a plurality of signal leads, the second TAB leadframe being superimposed with the first TAB leadframe such that the inner and outer lead portions of the ground leads of the first TAB leadframe and the signal leads of the second TAB leadframe lie substantially in a common plane;

a dielectric separating portions of the first and second TAB leadframes such that the first and second TAB leadframes are electrically isolated from each other; and a semiconductor die having a first plurality of bond pads which are electrically coupled to the inner lead portions of the ground leads of the first TAB leadframe and having a second plurality of bond pads which are electrically coupled to the signal leads of the second TAB leadframe.

10. The semiconductor device of claim 9 wherein the inner and outer lead portions of the ground leads lie in a plane which is different from, and substantially parallel to, the ground plane of the first TAB leadframe.

11. The semiconductor device of claim 10 wherein the inner and outer lead portions of each ground lead are substantially thinner than the central portion of each ground lead.

12. The semiconductor device of claim 11 wherein each signal lead has a predetermined thickness and wherein the inner and outer lead portions of each ground lead have thicknesses approximately equal to the predetermined thickness.

13. The semiconductor device of claim 9 wherein the dielectric is air.

14. The semiconductor device of claim 9 wherein the dielectric is an adhesive material having a dielectric constant ($\epsilon_r$) which is less than or equal to 3.5.

* * * * *